United States Patent [19]

Chee et al.

[11] Patent Number: 4,499,333
[45] Date of Patent: Feb. 12, 1985

[54] ELECTRONIC COMPONENT CAP AND SEAL

[75] Inventors: Aik T. Chee; Wee S. Kiat, both of Singapore, Singapore

[73] Assignee: Printed Circuits International, Inc., Sunnyvale, Calif.

[21] Appl. No.: 479,381

[22] Filed: Mar. 28, 1983

[51] Int. Cl.³ ............................................. H05K 5/06
[52] U.S. Cl. ................................. 174/52 FP; 357/74
[58] Field of Search ............... 174/52 FP; 361/399; 357/74

[56] References Cited

U.S. PATENT DOCUMENTS 3,404,215 10/1968 Burk et al. .................... 174/52 FP
3,495,023 2/1970 Hessinger et al. ............. 174/52 FP
3,693,252 9/1972 Robertson et al. ............. 174/52 FP

OTHER PUBLICATIONS

Cameron, "Installation of Chips on Printed Circuit Boards", *IBM Technical Disclosure Bulletin*, vol. 11, No. 8, Jan. 1969, p. 971.

*Primary Examiner*—A. T. Grimley
*Assistant Examiner*—D. A. Tone
*Attorney, Agent, or Firm*—Alan H. MacPherson; Thomas S. MacDonald

[57] ABSTRACT

A cap and seal including a central cap (20) to be positioned over an electronic component such as an integrated circuit chip (12), has a spaced upstanding wall or dam (22) which may be staked to the circuit board in assembly forming with the peripheral side wall (21) of the cap a channel or moat (19). Bridging means (24) extend between wall (21) and wall (22) onto which is placed a preform ring (30) of solid sealant material. Heating of the assembly, more particularly ring (30), allows melted sealant material to flow under and around bridging means (24) to form a confined seal between wall (21), wall (22) and an annular surface (29) on the circuit board surrounding cap wall (21).

19 Claims, 8 Drawing Figures

ELECTRONIC COMPONENT CAP AND SEAL

BACKGROUND OF THE INVENTION

1. Field of the Invention

This invention relates to a cap for protecting and sealing electronic components, more particularly, a discrete cover for sealing one or more integrated circuit chips or dies mounted on a printed circuit board.

The protection and sealing of electronic components such as an IC die is necessary due to the fineness and low structural strength of bonding wires leading from the die to contact pads on the metallization patterns of the printed circuit board and the need to prevent moisture and other contaminants from reaching the bonding wire joint and the interior of the die package.

2. Description of the Prior Art

From early on, electronic components have been potted by various insulating sealants within cans or provided with insulating envelopes surrounding the component(s). These methods, however, create mechanical stresses on the components, particularly on any wiring leading from the component. With the advent of microminiaturized integrated circuit devices and other micro-components, the problem of protecting the small-sized electrical connections necessitated by the micro-sized metallization patterns and contacts has been increasing. At the same time there is a necessity to increase yields in the fabrication process and a need for increased quality in the final product. In the case of integrated circuit dies the present state of the art involves utilizing a rectangular, normally square, flat-topped cap or box which is positioned over and around the die after the die has been affixed and bonding wires connected to the printed circuit board. Such cap or box may also have staking pins extending from its bottom edges at the open bottom of the cap, the pins being inserted into matching apertures in the circuit board for initially holding the cap in place. A liquid epoxy sealant is then flowed from a manually-operated syringe or complicated automated dispensing system, around the bottom periphery of the cap so that a sealing miniscus is formed between the exterior of the cap sides and the circuit board top surface.

In the above technique, it is difficult to control the flow of the dispense sealant. It has been found that use of the above-described caps often result in component failures due to inconsistent, uneven flow and sealing of the sealant and the susceptibility of the seal to break when the circuit board is subject to warpage or bending. Further, it has been found that the rectangular caps themselves may be subject to sufficient downward heat deformation, particularly at their center, bending or breaking off the delicate bonding wires leading from the IC die underneath the bottom surface of the top of the cap. The mounting and sealing of the present caps are difficult to automate, requiring special tooling and additional equipment. Further, without extreme care by the operator, the operation can become very messy with the sealant flowing over unwanted areas of the circuit board, into plate-through holes and otherwise causing unneeded problems. A relatively high material wastage has been experienced due to the use of liquid viscous sealing material. Even in satisfactory use they require a relatively large volume of sealant with resultant high costs since the miniscus or bead has a relatively large cross-section which extends over a relatively large area on the cap sides and then flows outwardly over a relatively large lateral area of the printed circuit board. This also affects the closeness that contact pins and plated through-holes can be placed with respect to the die dictating a larger size board for the desired components/patterns to be placed on the board.

SUMMARY

Many, if not all of the difficulties and shortcomings of prior art methods and protective caps are overcome by the present invention which, in its preferred embodiment, features a domed, circular cap surrounded by a spaced concentric, upstanding outer wall forming, with the wall or sides of the cap, a circular channel or moat. Bridging means are provided, extending medially of the channel to space the wall from the cap and to make an integral structure. A solid pre-formed ring of sealant is sized to seat on the top of the channel bridging means which upon heating, uniformly flows downward to fill the bottom of the channel or moat, underneath and around the top of the bridging means in order to form a confined seal between the wall, the cap sides, bridging means and an annular portion of the printed circuit board surface immediately surrounding the cap. Staking means are normally provided on the bottom of the concentric wall, radially outside of the resultant seal and thus not affecting the integrity of the resultant seal.

The above-described improved cap and seal is capable of little or no deformation from heat exposure having its strongest deformation resistance at the center. It provides for a uniform flow of a prefixed amount of sealant into the channel and results in consistant seal formation for more controlled reliability. The assembly of the seal is easily automated, merely entailing the staking of the integral cap and wall to the printed circuit board, the placement of a preform on the bridging members in the channel, and providing a heating step to flow the sealant into the bottom of the channel. No additional special tooling or equipment is needed. The operation is clean, there is no unwanted messy flow to other areas of the board since the concentric wall acts as a dam, and there is no wastage. Less sealant material is utilized and time-consuming manual operations are not needed, resulting in overall cost savings. The improved cap has shown very impressive failure reductions. In 1000 cycles of a $-65°$ C.$+150°$ C.-cycle involving 55 prior art samples of the type represented above as present state of the art and an equal number of the herein described cap and seal failures were reduced from 51 to 2. In other tests of high temperature operating life (90° C. for 1000 hours) and temperature/humidity (70° C. at 95% RH) the improved cap and seal equalled or exceeded the state of the art seal.

DETAILED DESCRIPTION

Figure 1:
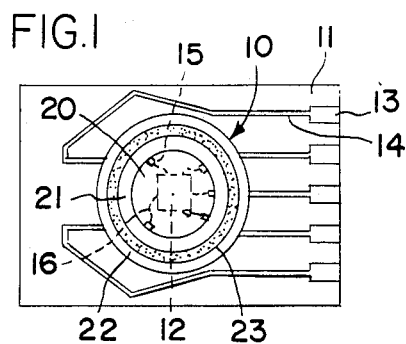
FIG. 1 is a top view of the cap and seal of the invention shown after final assembly on a printed circuit board.

FIG. 1 shows a top view of the cap and seal of this invention after the final assembly on a printed circuit board 11. Printed circuit board 11 is of conventional construction and shows a mounted integrated circuit chip 12 thereon and electrical contacts or terminals 13 extending from a peripheral edge. Metallization patterns 14 extend from the contacts to an area adjacent to the periphery of the mounted chip 12. The ends of the metallization patterns are connected at contacts 15 by suitable bonding wires 16 to input and output terminals of the chip 12.

The cap and seal 10 comprises a center cap having an inclined conical dome top 20, inclined side supporting walls 21 and a spaced upstanding wall member or dam 22, extending concentrically around the wall 21. The wall 21 is connected to the concentric wall 22 by a series of bridging means (FIGS. 2/3) over which is placed a circular preform of sealant material. A channel, groove, or moat is formed between the side walls 21 of central cap 20 and the concentric wall 22. Heating of the preform flows the sealant material into the channel or moat, resulting in an evenly distributed sealing band 23, extending peripherally around the exterior of walls 21 and interiorly of wall 22.

Figure 2:
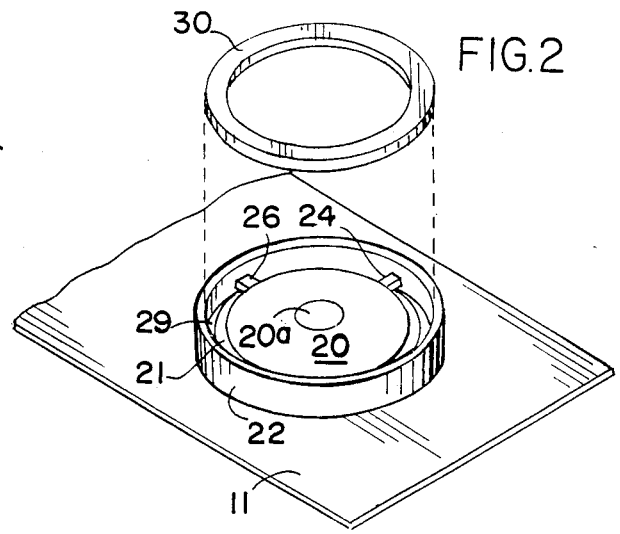
FIG. 2 is an exploded perspective view of the cap and seal being assembled on a printed circuit board.

FIG. 2 shows the cap and seal of the invention being assembled on printed circuit board 11. The dome 20 which in a preferred embodiment has a flat central surface 20a extends over the integrated circuit chip which has been affixed to the upper surface of board 11. Bridging means 24 and 26 are shown extending between the inner periphery of wall 22 and the outer periphery of wall 21. The bridging means 24 and 26 extend vertically below the top of wall 22 and below the dome top 20 of the central cap portion. Bridging members 24 and 26 are extend above the surface 29 of the printed circuit board 11. A preform ring 30 is placed on the top of bridging members 24 and 26 and upon heating, flows into the channel 19 formed between the respective walls 21 and 22. The melted preform sealant flows around, over and under bridging members 24 and 26 and onto the surface 29 of circuit board 11, thus forming a full annular seal along surface 29 between wall 21, wall 22 and printed circuit board 11. Bridging members are normally fully encapsulated but in some applications the preform may be sized to only fill the bottom of groove 19.

Figure 3:
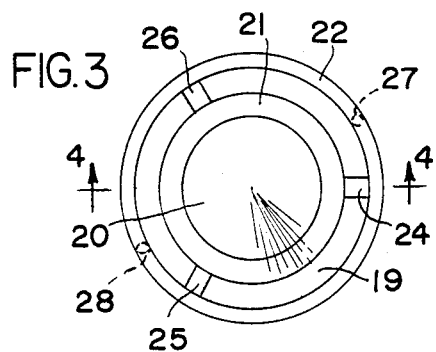
FIG. 3 is a top view of the integral cap and wall of the invention.

FIG. 3 shows a top view of the integral cap and wall of the invention. It comprises a central conical dome having a flat conical angle of approximately 160° and a peripheral inclined wall 21 extending at an angle of approximately 70° from the horizontal. The particular angles of the conical dome and the upstanding sidewall are dictated by the necessity for sufficient clearance above the integrated circuit chip and its bonding wires leading to the metallization patterns 13, 14 and 15 on the printed circuit board substrate. Bridging means 24, 25 and 26 are equi-spaced around the periphery of the wall 21 and 22 so as to make an integral structure. Stake means 27 and 28 comprising integral tapered tabs or pins extending downwardly from the bottom of wall 22 are insertable into matching apertures (not shown) in the circuit board. The staking means when the preform sealing ring is placed on bridging members 24–26 are outside of the resultant sealing volume in the channel or moat between wall 21 and 22 and do not result in a leak-path into the chip-holding chamber.

Figure 4:
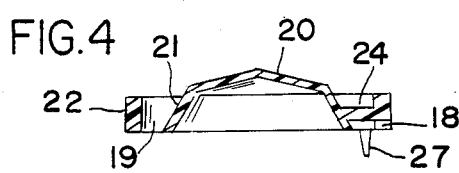
FIG. 4 is a cross-sectional view of FIG. 3 taken on the line 4—4.

FIG. 4 is a cross sectional view of FIG. 3 which shows clearly the channel or moat 19 formed between walls 21 and 22 and the medial positioning of bridging means 24 between wall 21 and wall 22. By "medial position" positioning is meant that the bridging means extends medially between the walls in vertical orientation so that the perform may sit on the upper surface of the bridging means, but below the upper extremity of walls 21 and 22 and extend above the bottom of the overall cap member. The preformed ring material when made molten, can flow underneath the bridging means 24 into complete contact peripherally and concentrically around the cap walls 21 and 22 and in contact with the annular portion 29 (FIG. 2) of the circuit board 11. FIG. 4 also shows clearly the staking means 27 extending below the concentric outer wall 11. The staking means is loosely placed in its circuit board aperture to allow air to escape from the sealant groove under the concentric wall at the curing temperature of the sealant.

Figure 5:
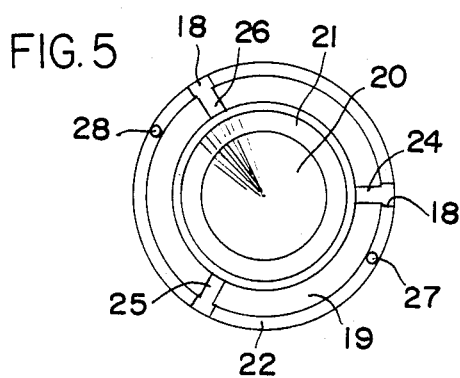
FIG. 5 is a bottom view of the FIG. 3 device.

FIG. 5 shows the underside of the cap member with the orientation of the staking means 27 and 28. A bottom groove 18 is provided in the wall 22 adjacent each of the bridging members 24, 25 and 26. This groove may be utilized for inspection purposes to ensure that the preform is flowing under bridging means 24, 25 and 26 so that a full seal is formed around the annular surface 29 of the circuit board. A small amount of sealant will be seen to flow or ooze out through each of the three grooves 18 at the outer peripheral edge of the wall 22 which will mean that flow has taken place underneath the bridging members. Grooves 18 also function to allow egress of air which might otherwise be trapped in the melted sealant material.

Figure 6:
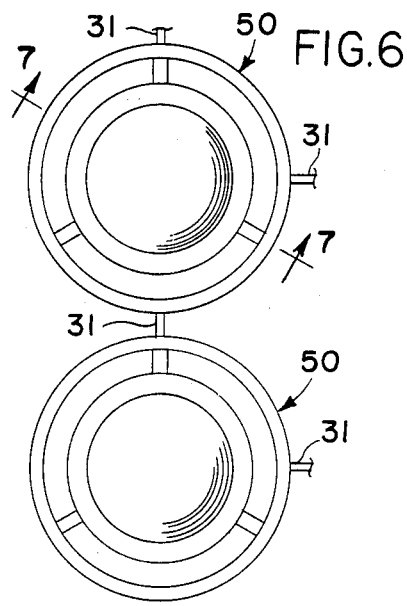
FIG. 6 shows a partial top view of an array of manufactured cap devices.

FIG. 6 shows a matrix of cap members 50, which are linked by frangible members 31 to other cap assemblies 50 which assemblies may be broken off the matrix and used individually on desired areas on a printed circuit board. Alternatively, the cap assembly 50 may be injection molded individually and used as desired.

Figure 7:
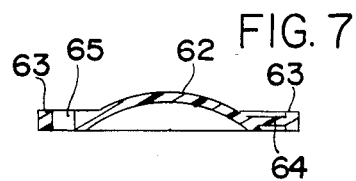
FIG. 7 is a cross-sectional view taken on the line 7—7 of FIG. 6 showing a modified cap cross-section.

FIG. 7 is a cross-sectional view taken on line 7—7 of FIG. 6 showing an alternative form of the cap member. In this embodiment, a full curved dome 62 is provided in the central portion of the overall cap, the central dome 62 flares into wall 63 through bridging means 64 forming groove 65 around the periphery of dome 62. Bridging means 64 connects wall 63 with dome 62.

Figure 8:
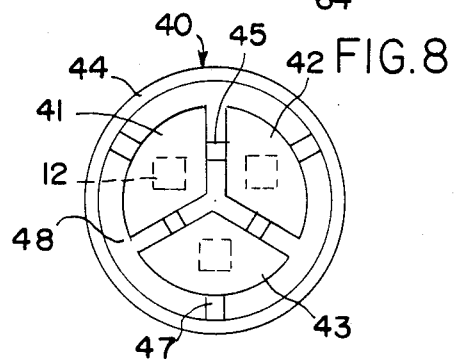
FIG. 8 shows a top view of a multi-cap sealing device for sealing a series of components or dies.

In FIG. 8 a multi-cap device is shown at 40 wherein a series of individually-shaped caps 41, 42 and 43 are placed over a matrix of chips 12. Each of the caps extends above the chips 12 and are interconnected by bridging means 45 to each other and by bridging means 47 to an outer wall 44. Channel or moat 48 extends around the periphery of the three caps 41, 42 and 43, and extends between the facing peripheries of the caps under and over bridging means 45. A preform corresponding to the shape of channel 48 is then placed around the caps and then flowed into the channel bottom. This type of assembly 40 is used in those instances where it is desired to individually protect and seal multiple caps on a printed circuit board substrate.

While the invention has been described in terms of the protection of an integrated circuit chip, it is to be understood that the invention may be used to protect other electronic components on a printed circuit board or in other applications.

The cap member of this invention may be made of various materials, but is preferably made of Ryton R-4 thermoplastic material. The preform may be of epoxy material which, when heated at 120° C., slumps or melts into its sealing configuration. A preferred configuration of the dome 20 is a 60° angle on the incline walls of the central cap member, a 156° annular conical top section, and a central flat dome of approximately 3 millimeters diameter. In a commercial embodiment, the overall cap member 10 is 21 millimeters in diameter with a cap height of 3.03 millimeters.

The above description of the advantages and embodiments of this invention is intended to be illustrative only, and not limiting. Other embodiments of this invention will be apparent to those skilled in the art in view of the above disclosure.

We claim:

1. A cover for an electronic component mounted on a substrate comprising an upstanding continuous boundary wall, an imperforate cap portion spaced interiorly of said wall and forming with said wall a continuous open-top channel, said cap portion adapted to encompass said electronic component, and means for spacing said wall and said cap portion without blocking all of said channel.

2. The invention of claim 1 in which said means comprises a series of bridging members extending across said channel at a medial vertical position of said channel.

3. The invention of claim 1 in which cap portion is a central circular dome and said boundary wall extends concentrical therearound.

4. The invention of claim 1 in which said cap portion extends vertically above said boundary wall.

5. The invention of claim 1 in which said cap portion comprises a circular inclined wall and a conical top continually bridging said inclined wall.

6. The invention of claim 1 in which said cap portion comprises a central curved dome.

7. The invention of claim 1 further including stake means extending from a bottom edge of said boundary wall adapted to mate with an aperture in said substrate.

8. The invention of claim 1 further including sealing material adapted to be placed in said channel to seal peripheral bottom side edges of said cap portion to a substrate.

9. The invention of claim 8 in which said sealing material is a preform insertable above said channel and adapted, upon heating, to flow into sealing position in said channel between said peripheral bottom side edges of said cap portion, said boundary wall and substrate.

10. The invention of claim 1 comprising a series of multiple cap portions fixedly connected to said boundary wall and spaced from each other and from said boundary wall, forming multiple channels, said means comprising bridging members between said boundary wall and said cap portions and means for connecting each of said cap portions to other cap portions.

11. The invention of claim 1 comprising a matrix of covers as therein recited with means to detach adjacent covers from one another.

12. In a circuit board having an integrated circuit chip mounted thereon, metallization patterns extending over a surface of the board, and a cover positionable over the chip, the improvement comprising an upstanding imperforate cap extending over the chip having the cap periphery in contact with said board, an upstanding continuous wall surrounding and spaced from said cap forming a channel extending to said board surface, and sealing means insertable into said channel to seal the periphery of said cap to said board.

13. The invention of claim 12 further including means extending across said channel connecting said wall and said cap without blocking all of said channel.

14. The invention of claim 12 in which said sealing means is a solid continuous preform of sealant insertable in said channel and adapted upon flowing to seal said continuous wall and peripheral portions of said cap to said board.

15. The invention of claim 14 including bridging means extending across said channel connecting said wall and said cap, said bridging means extending medially between upper and lower edges of said wall and said cap so that sealing means flows above and below said bridging means providing a continuous band of sealing means around said cap in attachment to said board.

16. The invention of claim 12 in which said cap is a circular dome and said wall is concentrically spaced therefrom.

17. The invention of claim 12 in which said continuous wall and said cap are integrally formed with a series of bridging members connected therebetween.

18. The invention of claim 12 in which said wall is circular and multiple caps are connected thereto inwardly spaced from said wall, sealant channels being formed between said multiple caps in flow communication with said first-mentioned channel formed with said continuous wall.

19. The invention of claim 12 in which said continuous wall includes stake means extending outwardly from a bottom surface of the continuous wall, said board including aperture means surrounding said chip to receive said stake means.

* * * * *